United States Patent
Saxler et al.

(10) Patent No.: US 7,432,142 B2
(45) Date of Patent: Oct. 7, 2008

(54) METHODS OF FABRICATING NITRIDE-BASED TRANSISTORS HAVING REGROWN OHMIC CONTACT REGIONS

(75) Inventors: Adam William Saxler, Durham, NC (US); Richard Peter Smith, Carrboro, NC (US)

(73) Assignee: Cree, Inc., Durham, NC (US)

( * ) Notice: Subject to any disclaimer, the term of this patent is extended or adjusted under 35 U.S.C. 154(b) by 212 days.

(21) Appl. No.: 10/849,617

(22) Filed: May 20, 2004

(65) Prior Publication Data

US 2005/0258451 A1    Nov. 24, 2005

(51) Int. Cl.
*H01L 21/338* (2006.01)
(52) U.S. Cl. .......................... 438/167; 438/22; 438/46; 438/47; 438/172
(58) Field of Classification Search .................. None
See application file for complete search history.

(56) References Cited

U.S. PATENT DOCUMENTS

| | | | |
|---|---|---|---|
| 4,424,525 A | | 1/1984 | Mimura |
| 4,471,366 A | | 9/1984 | Delagebeaudeuf et al. |
| 4,727,403 A | | 2/1988 | Hilda et al. |
| 4,755,867 A | | 7/1988 | Cheng |
| 4,788,156 A | | 11/1988 | Stoneham et al. |
| 4,946,547 A | | 8/1990 | Palmour et al. |
| 5,053,348 A | | 10/1991 | Mishra et al. |
| 5,140,386 A | * | 8/1992 | Huang et al. ................. 257/194 |
| 5,172,197 A | | 12/1992 | Nguyen et al. |

(Continued)

FOREIGN PATENT DOCUMENTS

EP    0 334 006 A1    9/1989

(Continued)

OTHER PUBLICATIONS

International Search Report corresponding to PCT/US2005/004039, mailed Jun. 30, 2005.

(Continued)

*Primary Examiner*—Zandra Smith
*Assistant Examiner*—Khanh B Duong
(74) *Attorney, Agent, or Firm*—Myers Bigel Sibley & Sajovec PA

(57) ABSTRACT

Transistor fabrication includes forming a nitride-based channel layer on a substrate, forming a barrier layer on the nitride-based channel layer, forming a contact recess in the barrier layer to expose a contact region of the nitride-based channel layer, forming a contact layer on the exposed contact region of the nitride-based channel layer, for example, using a low temperature deposition process, forming an ohmic contact on the contact layer and forming a gate contact disposed on the barrier layer adjacent the ohmic contact. A high electron mobility transistor (HEMT) and methods of fabricating a HEMT are also provided. The HEMT includes a nitride-based channel layer on a substrate, a barrier layer on the nitride-based channel layer, a contact recess in the barrier layer that extends into the channel layer, an n-type nitride-based semiconductor material contact region on the nitride-based channel layer in the contact recess, an ohmic contact on the nitride-based contact region and a gate contact disposed on the barrier layer adjacent the ohmic contact. The n-type nitride-based semiconductor material contact region and the nitride-based channel layer include a surface area enlargement structure.

26 Claims, 8 Drawing Sheets

U.S. PATENT DOCUMENTS

| | | | |
|---|---|---|---|
| 5,192,987 | A | 3/1993 | Khan et al. |
| 5,200,022 | A | 4/1993 | Kong et al. |
| 5,210,051 | A | 5/1993 | Carter, Jr. |
| 5,292,501 | A | 3/1994 | Degenhardt et al. |
| 5,296,395 | A | 3/1994 | Khan et al. |
| 5,298,445 | A | 3/1994 | Asano |
| RE34,861 | E | 2/1995 | Davis et al. |
| 5,389,571 | A | 2/1995 | Takeuchi et al. |
| 5,393,993 | A | 2/1995 | Edmond et al. |
| 5,523,589 | A | 6/1996 | Edmond et al. |
| 5,534,462 | A | 7/1996 | Fiordalice et al. |
| 5,592,501 | A | 1/1997 | Edmond et al. ............... 372/45 |
| 5,686,737 | A | 11/1997 | Allen |
| 5,698,870 | A * | 12/1997 | Nakano et al. ............ 257/194 |
| 5,700,714 | A | 12/1997 | Ogihara et al. |
| 5,701,019 | A | 12/1997 | Matsumoto et al. |
| 5,705,827 | A | 1/1998 | Baba et al. |
| 5,804,482 | A | 9/1998 | Konstantinov et al. |
| 5,885,860 | A | 3/1999 | Weitzel et al. |
| 5,946,547 | A | 8/1999 | Kim et al. |
| 5,990,531 | A | 11/1999 | Taskar et al. |
| 6,028,328 | A | 2/2000 | Riechert et al. |
| 6,046,464 | A | 4/2000 | Schetzina |
| 6,064,082 | A | 5/2000 | Kawai et al. |
| 6,086,673 | A | 7/2000 | Molnar |
| 6,150,680 | A | 11/2000 | Eastman et al. |
| 6,177,685 | B1 | 1/2001 | Teraguchi et al. |
| 6,218,680 | B1 | 4/2001 | Carter, Jr. et al. |
| 6,316,793 | B1 | 11/2001 | Sheppard |
| 6,429,467 | B1 | 8/2002 | Ando |
| 6,448,648 | B1 | 9/2002 | Boos |
| 6,492,669 | B2 | 12/2002 | Nakayama et al. |
| 6,515,316 | B1 | 2/2003 | Wojtowicz et al. |
| 6,533,874 | B1 * | 3/2003 | Vaudo et al. ............... 148/33.5 |
| 6,534,801 | B2 * | 3/2003 | Yoshida ..................... 257/192 |
| 6,548,333 | B2 | 4/2003 | Smith |
| 6,586,781 | B2 | 7/2003 | Wu et al. |
| 6,639,255 | B2 | 10/2003 | Inoue et al. |
| 6,674,101 | B2 * | 1/2004 | Yoshida ..................... 257/194 |
| 6,727,531 | B1 * | 4/2004 | Redwing et al. ............ 257/194 |
| 6,841,809 | B2 * | 1/2005 | Fareed et al. ................ 257/192 |
| 2001/0015446 | A1 | 8/2001 | Inoue et al. |
| 2001/0020700 | A1 | 9/2001 | Inoue et al. |
| 2001/0023964 | A1 | 9/2001 | Wu et al. |
| 2001/0040246 | A1 | 11/2001 | Ishii |
| 2002/0008241 | A1 | 1/2002 | Edmond et al. |
| 2002/0017696 | A1 | 2/2002 | Nakayama et al. |
| 2002/0066908 | A1 | 6/2002 | Smith |
| 2002/0079508 | A1 | 6/2002 | Yoshida |
| 2002/0119610 | A1 | 8/2002 | Nishii et al. |
| 2002/0167023 | A1 | 11/2002 | Charvarkar et al. |
| 2003/0017683 | A1 | 1/2003 | Emrick et al. |
| 2003/0020092 | A1 | 1/2003 | Parikh et al. |
| 2003/0102482 | A1 | 6/2003 | Saxler |
| 2003/0123829 | A1 | 7/2003 | Taylor |
| 2003/0145784 | A1 | 8/2003 | Thompson et al. |
| 2003/0157776 | A1 | 8/2003 | Smith |
| 2003/0213975 | A1 | 11/2003 | Hirose et al. |
| 2004/0004223 | A1 | 1/2004 | Nagahama et al. |
| 2004/0021152 | A1 | 2/2004 | Nguyen et al. |
| 2004/0029330 | A1 | 2/2004 | Hussain et al. |
| 2004/0061129 | A1 | 4/2004 | Saxler et al. |
| 2004/0241970 | A1 | 12/2004 | Ring |

FOREIGN PATENT DOCUMENTS

| | | |
|---|---|---|
| EP | 0 563 847 A2 | 10/1993 |
| JP | 10-050982 | 2/1998 |
| JP | 11261053 | 9/1999 |
| JP | 2001230401 A | 8/2001 |
| JP | 2002016087 A | 1/2002 |
| JP | 2004-342810 | 12/2004 |
| WO | WO 93/23877 A1 | 11/1993 |
| WO | WO 01/57929 A1 | 8/2001 |
| WO | WO 03/049193 A1 | 6/2003 |
| WO | WO 2004/008495 | 1/2004 |

OTHER PUBLICATIONS

Beaumont, B. et al., "Epitaxial Lateral Overgrowth of GaN," *Phys. Stat. Sol.* (b) 227, No. 1, pp. 1-43 (2001).

Ando et al., "10-W/mm AlGaN-GaN HFET With a Field Modulating Plate," *IEEE Electron Device Letters*, 24(5), pp. 289-291 (May 2003).

Chang et al., "AlGaN/GaN Modulation-Doped Field-Effect Transistors with an Mg-doped Carrier Confinement Layer," *Jpn. J. Appl. Phys.*, 42:3316-3319 (2003).

Chini et al., "Power and Linearity Characteristics of Field-Plagted Recessed-Gate AlGaN-GaN HEMTs," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys.* 33:775-778 (1994).

Coffie et al., Unpassivated p-GaN/AlGaN/GaN HEMTs with 7.1 W/MMF at 10 GHz, *Electronic Letters online* No. 20030872, 39(19), (Sep. 18, 2003).

Gaska et al., "Self-Heating in High-Power AlGaN/GaN HFET's," *IEEE Electron Device Letters*, 19(3), pp. 89-91 (Mar. 1998).

Hikita et al., "350V/150A AlGaN/GaN Power HFET on Silicon Substrate With Source-via Grouding (SVG) Structure," *Electron Devices Meeting*, 2004, pp. 803-806, IEDM Technical Digest. IEEE International (Dec. 2004).

Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kashahara et al., "Ka-ban 2.3W Power AlGan/GaN Heterojunction FET," *IEDM Technical Digest*, pp. 677-680 (2002).

Komiak et al., "Fully Monolithic 4 Watt High Efficiency Ka-band Power Amplifier," *IEEE MTT-S International Microwave Symposium Digest*, vol. 3, pp. 947-950 (1999).

Küsters et al., "Double-Heterojunction Lattice-Matched and Pseudomorphic InGaAs HEMT with δ-Doped InP Supply Layers and p-InP Barier Enhancement Layer Grown by LP-MOVPE," *IEEE Electron Device Letters*, 14(1), (Jan. 1993).

Manfra et al., "Electron Mobility Exceeding 160 000 $cm^2$/V s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Parikh et al., "Development of Gallium Nitride Epitaxy and Associated Material-Device Correlation for RF, Microwave and MM-wave Applications," Cree, Inc. (35 slides).

Saxler et al., "III-Nitride Heterostructures on High-Purity Semi-Insulating 4H-SiC Substrates for High-Power RF Transistors," International Workshop on Nitride Semiconductors (Jul. 19, 2004).

Shiojima et al., "Improved Carrier Confinement by a Buried p-Layer in the AlGaN/GaN HEMT Structure," *IEICE Trans. Electron.*, E83-C(12), (Dec. 2000).

"Thick AIN template on SiC substrate—Novel semi insulating substrate for GaN-based devices," © 2003 by TDI, Inc., http://www.tdii.com/products/AIN_SiCT.html.

Tilak et al., "Influence of Barrier Thickness on the High-Power Performance of AlGaN/GaN HEMTs," *IEEE Electron Device Letters*, 22(1), pp. 504-506 (Nov. 2001).
United States Patent Application entitled "Improved Dielectric Passivation for Semiconductor Devices," U.S. Appl. No. 10/851,507, filed May 22, 2004.
United States Patent Application entitled "Silicon Carbide on Diamond Substrates and Related Devices and Methods," U.S. Appl. No. 10/707,898, filed Jan. 22, 2004.
United States Patent Application entitled "Methods of Fabricating Nitride-Based Transistors with a Cap Layer and a Recessed Gate," U.S. Appl. No. 10/897,726, filed Jul. 23, 2004.
United States Patent Application entitled "High Power Density and/or Linearity Transistors," U.S. Appl. No. 11/005,107, filed Dec. 6, 2004.
United States Patent Application entitled "Field Effect Transistors (FETS) Having Multi-Watt Output Power at Millimeter-Wave Frequencies," U.S. Appl. No. 11/005,423, filed Dec. 6, 2004.
United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.
United States Patent Application entitled "Aluminum Free Group III-Nitride Based High Electron Mobility Transistors and Methods of Fabricating Same," U.S. Appl. No. 11/118,575, filed Apr. 29, 2005.
United States Patent Application entitled "Binary Group III-Nitride Based High Electron Mobility Transistors and Methods of Fabricating Same," U.S. Appl. No. 11/118,675, filed Apr. 29, 2005.
United States Patent Application entitled "Composite Substrates of Conductive And Insulating or Semi-Insulating Group III-Nitrides For Group III-Nitride Devices," U.S. Appl. No. 11/103,127, filed Apr. 11, 2005.
United States Patent Application entitled "Thick Semi-Insulating or Insulating Epitaxial Gallium Nitride Layers and Devices Incorporating Same," U.S. Appl. No. 11/103,117, filed Apr. 11, 2005.
United States Patent Application entitled "Cap Layers and/or Passivation Layers for Nitride-Based Transistors, Transistor Structures and Methods of Fabricating Same," U.S. Appl. No. 10/996,249, filed Nov. 23, 2004.
Walker, J. L. B. (Ed.), *High Power GaAs FET Amplifiers*, Norwood, MA: Artech House, pp. 119-120 (1993).
Wu et al., "3.5-Watt AlGaN/GaN HEMTs and Amplifiers at 35 GHz," IEDM-2003, Cree, Inc.
Wu et al., "3.5-Watt AlGaN/GaN HEMTs and Amplifiers at 35 GHz," Cree Santa Barbara Technology Center, Goleta, CA 93117.
Wu et al., "30-W/mm GaN HEMTs by Field Plate Optimization," *IEEE Electron Device Letters*, 25(3), pp. 117-119 (Mar. 2004).
Wu et al., "Bias-dependent Performance of High-Power AlGaN/GaN HEMTs," *IEDM Technical Digest*, p. 378-380 (2001).
Wu et al., "Linearity Performance of GaN HEMTs With Field Plates," DRC 2004, Cree, Inc.
Wu et al., "Linearity Performance of GaN HEMTs With Field Plates," Cree Santa Barbara Technology Center, Goleta, CA 93117.
Yu et al., "Schottky Barrier Engineering in III-V Nitrides via the Piezoelectric Effect," *Applied Physics Letters*, 73(13), pp. 1880-1882 (Sep. 28, 1998).
Zhang et al., "High Breakdown GaN HEMT with Overlapping Gate Structure," *IEEE Electron Device Letters*, 21(9), pp. 421-423 (Sep. 2000).
Ambacher et al., "Two Dimensional Electron Gases Induced by Spontaneous and Piezoelectric Polarization Charges in N- and Ga-face AlGaN/GaN Heterostructures," *Journal of Applied Physics*, vol. 85, No. 6, pp. 3222-3233 (Mar. 1999).
Asbeck et al. "Piezoelectric charge densities in AlGaN/GaN HFETs," *Electronics Letters*. vol. 33, No. 14, pp. 1230-1231 (1997).
Ben-Yaacov et al., "AlGaN/GaN Current Aperture Vertical Electron Transistors with Regrown Channels," *Journal of Applied Physics*. vol. 95, No. 4, pp. 2073-2078 (2004).
Breitschadel et al. "Minimization of Leakage Current of Recessed Gate AlGaN/GaN HEMTs by Optimizing the Dry-Etching Process," *Journal of Electronic Materials*. vol. 28, No. 12, pp. 1420-1423 (1999).

Burm et al. "Recessed Gate GaN MODFETs," *Solid-State Electronics*. vol. 41, No. 2, pp. 247-250 (1997).
Burm et al. "Ultra-Low Resistive Ohmic Contacts on n-GaN Using Si Implantation," *Applied Physics Letters*. vol. 70, No. 4, 464-66 (1997).
Chen et al. "Cl2 reactive ion etching for gate recessing of AlGaN/GaN field-effect transistors," *J. Vac. Sci. Technol. B*. vol. 17, No. 6, pp. 2755-2758 (1999).
Eastman et al. "GaN materials for high power microwave amplifiers," *Mat. Res. Soc. Symp. Proc*. vol. 512 (1998).
Eastman et al. "Undoped AlGaN/GaN HEMTs for Microwave Power Amplification," *IEEE Transactions on Electron Devices*. vol. 48, No. 3, pp. 479-485 (Mar. 2001).
Egawa et al. "Recessed gate ALGaN/GaN MODFET on Sapphire Grown by MOCVD," *Applied Physics Letters*. vol. 76, No. 1, pp. 121-123 (Jan. 2000).
Gaska et al. "High-Temperature Performance on AlGaN/GaN HFET's on SiC Substrates," *IEEE Electron Device Letters*. vol. 18, No. 1, pp, 492-494 (Oct. 1997).
Gaska et al. "Electron Transport in AlGaN/GaN Heterostructures Grown on 6H-SiC Substrates," *Applied Physics Letters*. vol. 72, No. 6, pp. 707-709 (Feb. 1998).
Gelmont et al. "Monte Carlo simulation of electron transport in gallium nitride," *Journal of Applied Physics*. vol. 74, No. 3, pp. 1818-1821 (Aug. 1993).
Heikman, et al., "Mass Transport Regrowth of GaN for Ohmic Contacts to AlGaN/GaN," *Applied Physics Letters*. vol. 78, No. 19, pp. 2876.
Heikman et al. "Polarization Effects in AlGaN/GaN and GaN/AlGaN/GaN heterostructures," *Journal of Applied Physics*. vol. 93, No. 12, pp. 10114-10118 (Jun. 2003).
Heikman et al., "Growth of Fe-Doped Semi-insulating GaN by Metalorganic Chemical Vapor Deposition," *Applied Physics Letters*. vol. 83, No. 1, pp. 439-441 (Jul. 2002).
Heikman, Sten K., *MOCVD Growth Technologies for Applications in AlGaN/GaN High Electron Mobility Transistors, Dissertation*, University of California—Santa Barbara, Sep. 2002, 190 pages.
Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).
Karmalkar et al. "RESURF AlGaN/GaN HEMT for High Voltage Power Switching," *IEEE Electron Device Letters*. vol. 22, No. 8, pp. 373-375 (Aug, 2001).
Kuzmik et al. "Annealing of Schottky contacts deposited on dry etched AlGaN/Gan," *Semiconductor Science and Technology*. vol. 17, No. 11 (Nov. 2002).
Neuburger et al. "Design of GaN-based Field Effect Transistor Structures based on Doping Screening of Polarization Fields," WA 1.5, 7th Wide-Gandgap III-Nitride Workship (Mar. 2002).
Ping et al. "DC and Microwave Performance of High-Current AlGaN/GaN Heterostructure Field Effect Transistors Grown on p-Type SiC Substrates," *IEEE Electron Device Letters*. vol. 19, no. 2, pp. 54-56 (Feb. 1998).
Sheppard et al. "High Power Demonstration at 10 GHz with GaN/AlGaN HEMT Hybrid Amplifiers." Presented at the 58th DRC, Denver, CO, Jun. 2000.
Sheppard et al. "Improved 10-GHz Operation of GaN/AlGaN HEMTs on Silicon Carbide," *Materials Science Forum*. vols. 338-342, pp. 1643-1646, (2000).
Shen et al., "High-Power Polarization-Engineered GaN/AlGaN/GaN HEMTs Without Surface Passivation," *IEEE Electronics Device Letters*. vol. 25, No. 1, pp. 7-9 (2004).
Sriram et al. "RF Performance of AlGaN/GaN MODFET's on High Resistivity SiC Substrates," Presentation at Materials Research Society Fall Symposium , 1997.
Sriram et al. "SiC and GaN Wide Bandgap Microwave Power Transistors," *IEEE Sarnoff Symposium*, Pittsburgh, PA, Mar. 18, 1998.
Sullivan et al. "High-Power 10-GHz Operation of AlGaN HFET's on Insulating SiC," *IEEE Electron Device Letters*. vol. 19, No. 6, pp. 198-200 (Jun. 1998).
Wu et al. "30-W/mm GaN HEMTs by Field Plate Optimization," *IEEE Electron Device Letters*. vol. 25, No. 3, pp. 117-119 (Mar. 2004).

Wu et al. "High Al-Content AlGaN/GaN MODFET's for Ultrahigh Performance," *IEEE Electron Device Letters*. vol. 19, No. 2, pp. 50-53 (Feb. 1998).

Yu et al. "Schottky barrier engineering in III-V nitrides via the piezoelectric effect," *Applied Physics Letters*. vol. 73, No. 13, pp. 1880-1882, (Sep. 1998).

United States Patent Application entitled "Co-Doping for Fermi Level Control in Semi-Insulating Group III Nitrides," filed Jan. 7, 2004.

United States Patent Application entitled "Nitride Heterojunction Transistors Having Charge-Transfer Induced Energy Barriers and Methods of Fabricating the Same," U.S. Appl. No. 10/772,882, filed Feb. 5, 2004.

United States Patent Application entitled "Nitride-Based Transistors with a Protective Layer and a Low-Damage Recess and Methods of Fabrication Thereof," U.S. Appl. No. 10/758,871, filed Jan. 16, 2004.

United States Patent Application entitled "Nitride-Based Transistors and Methods of Fabrication Thereof Using Non-Etched Contact Recesses," U.S. Appl. No. 10/617,843, filed Jul. 11, 2003.

United States Patent Application entitled "Semiconductor Devices Having a Hybrid Channel Layer, Current Aperture Transistors and Methods of Fabricating the Same," U.S. Appl. No. 10/849,589, filed May 20, 2004.

United States Patent Application entitled "Methods of Fabricating Nitride-Based Transistors with a Cap Layer and a Recessed Gate," filed Jul. 23, 2004.

United States Patent Application entitled "Methods of Having Laterally Grown Active Region and Methods of Fabricating Same," filed Jul. 26, 2004.

United States Patent Application entitled, "Silicon Carbide on Diamond Substrates and Related Devices and Methods,".

* cited by examiner

METHODS OF FABRICATING NITRIDE-BASED TRANSISTORS HAVING REGROWN OHMIC CONTACT REGIONS

FIELD OF THE INVENTION

The present invention relates to semiconductor devices and, more particularly, to transistors that incorporate nitride-based active layers.

BACKGROUND

The present invention relates to transistors formed of semiconductor materials that can make them suitable for high power, high temperature, and/or high frequency applications. Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

One issue with the fabrication of nitride-based transistors involves the formation of ohmic contacts for such transistors. Conventionally, ohmic contacts have been formed through reactive ion etching (RIE) recesses for the contacts. However, without strict process control practices, RIE in nitride based materials may suffer from uniformity and reproducibility problems. Such problems could result in difficulty in controlling a fabrication process. Ohmic contacts that are formed without RIE have, typically, used high annealing temperatures (e.g. 900° C.). Such high annealing temperatures may damage the materials and/or the device.

SUMMARY OF THE INVENTION

Some embodiments of the present invention provide for fabrication of a transistor including forming a nitride-based channel layer on a substrate, forming a barrier layer on the nitride-based channel layer, forming a contact recess in the barrier layer to expose a contact region of the nitride-based channel layer and forming a contact layer on the exposed contact region of the nitride-based channel layer using a low temperature deposition process. Fabrication may also include forming an ohmic contact on the contact layer and forming a gate contact disposed on the barrier layer adjacent the ohmic contact.

In further embodiments of the present invention, forming a contact layer on the exposed contact region of the nitride-based channel layer using a low temperature deposition process includes forming a contact layer by metal organic chemical vapor deposition (MOCVD), molecular beam epitaxy (MBE), plasma enchanced chemical vapor deposition (PECVD), sputtering and/or hydride vapor phase epitaxy (HVPE). Furthermore, the low temperature deposition process may be a process other than mass transport from a wafer on which the transistor is formed.

In additional embodiments of the present invention, fabrication of the transistor further includes forming a first dielectric layer on the barrier layer and forming a recess in the first dielectric layer. Forming a gate contact includes forming a gate contact in the recess. Forming a contact recess includes forming a contact recess in the first dielectric layer and the barrier layer that exposes a portion of the nitride-based channel layer. In other embodiments of the present invention, the gate contact may be formed on the first dielectric layer.

In still further embodiments of the present invention, the first dielectric layer comprises a silicon nitride layer. The silicon nitride layer may provide a passivation layer for the transistor.

In additional embodiments of the present invention, the contact recess extends into the channel layer. Furthermore, forming an ohmic contact may include forming an ohmic contact without annealing the ohmic contact. Forming an ohmic contact could include patterning a metal layer on the contact layer and annealing the patterned metal layer at a temperature of about 850° C. or less.

In other embodiments of the present invention, forming a contact layer on the exposed portions of the nitride-based channel layer includes forming a contact layer on the exposed portion of the nitride-based channel layer to a thickness sufficient to provide a sheet resistivity of less than a sheet resistivity of a two-dimensional electron gas region formed at an interface between the channel layer and the barrier layer.

Forming a contact layer may include forming n-type an InGaN, AlInN, AlInGaN and/or InN layer. In some embodiments of the present invention, the n-type nitride-based layer formed is GaN and/or AlGaN. The InGaN, GaN, AlGaN, AlInN, AlInGaN and/or InN layer may be doped with Si, Ge and/or O during formation.

In some embodiments of the present invention, the contact layer includes an n-type degenerate semiconductor material other than GaN and AlGaN. The contact layer may include a non-nitride Group III-V semiconductor material, a Group IV semiconductor material and/or a group III-VI semiconductor material.

In additional embodiments of the present invention, fabrication of the transistor further includes forming sidewalls of the channel layer to provide an increased surface area interface between the channel layer and the n-type contact layer as compared to a planar interface. Forming an ohmic contact on the contact layer may include forming an ohmic contact on the contact layer that extends onto a portion of the channel layer or that terminates before the sidewall of the channel layer.

In further embodiments of the present invention, fabrication of the transistor includes forming holes in the channel layer adjacent the contact regions and placing n-type nitride-based semiconductor material in the holes. Forming an ohmic contact on the contact layer further includes forming an ohmic contact on the contact layer and on the nitride-based semiconductor material in the holes.

In additional embodiments of the present invention, the contact layer extends onto the barrier layer.

In still other embodiments of the present invention, fabricating a transistor includes forming a nitride-based channel layer on a substrate, forming a barrier layer on the nitride-based channel layer, forming a masking layer on the barrier layer, patterning the masking layer and the barrier layer to provide contact opening that exposes a portion of the nitride-based channel layer, forming a contact layer on the exposed portion of the nitride-based channel layer and the masking layer, selectively removing the masking layer and a portion of the contact layer on the masking layer to provide a contact region, forming an ohmic contact on the contact region and forming a gate contact disposed on the barrier layer adjacent the ohmic contact. Fabrication of the transistor may also include forming a first dielectric layer on the barrier layer and forming a recess in the first dielectric layer. Forming a gate contact may include forming a gate contact in the recess. Forming a masking layer on the barrier layer may include forming a masking layer on the first dielectric layer. Patterning the masking layer and the barrier layer to provide contact openings that expose a portion of the nitride-based channel layer may include patterning the masking layer, the first dielectric layer and the barrier layer to provide contact opening that exposes a portion of the nitride-based channel layer.

In certain embodiments of the present invention, the first dielectric layer includes a silicon nitride layer. The silicon nitride layer may provide a passivation layer for the transistor. The masking layer may be a dielectric layer. The dielectric layer may be a silicon oxide layer. The masking layer could be a photoresist masking layer.

Forming an ohmic contact may be provided by forming an ohmic contact without annealing the ohmic contact. Alternatively, forming an ohmic contact may be provided by patterning a metal layer on the contact region and annealing the patterned metal layer at a temperature of about 850° C. or less.

Forming a contact layer on the exposed portion of the nitride-based channel layer and the oxide layer may include forming a contact layer by metal organic chemical vapor deposition (MOCVD), molecular beam epitaxy (MBE), plasma enhanced chemical vapor deposition (PECVD), sputtering and/or hydride vapor phase epitaxy (HVPE). Forming a contact layer on the exposed portions of the nitride-based channel layer and the masking layer may be provided by forming a contact layer on the exposed portions of the nitride-based channel layer and the masking layer to a thickness sufficient to provide a sheet resistivity of less than a sheet resistivity of a two-dimensional electron gas region formed at an interface between the channel layer and the barrier layer. Forming a contact layer may include forming an n-type InGaN, AlInGaN, InAlN and/or InN layer. In some embodiments, the nitride based contact layer may be GaN and/or AlGaN. The InGaN, AlInGaN, InAlN, GaN, AlGaN and/or InN layer may be doped with Si, Ge and/or O during formation.

In further embodiments of the present invention, fabrication of the transistor includes forming sidewalls of the channel layer to provide an increased surface area interface between the channel layer and the n-type contact layer compared to a planar interface. Forming an ohmic contact on the contact layer may include forming an ohmic contact on the contact layer that extends onto a portion of the channel layer or that terminates before the sidewall of the channel layer. Additionally or alternatively, fabrication of the transistor may include forming holes in the channel layer adjacent the contact regions and placing a nitride-based semiconductor material in the holes. Forming an ohmic contact on the nitride-based contact region may include forming an ohmic contact on the nitride-based contact region and on the nitride-based semiconductor material in the holes.

In other embodiments of the present invention, a high electron mobility transistor (HEMT) and methods of fabricating a HEMT are provided. The HEMT includes a nitride-based channel layer on a substrate, a barrier layer on the nitride-based channel layer, a contact recess in the barrier layer that extends into the channel layer, a contact region on the nitride-based channel layer in the contact recess, a gate contact disposed on the barrier layer. The contact region and the nitride-based channel layer include a surface area enlargement structure.

In some embodiments of the present invention, the surface area enlargement structure includes patterned sidewalls of portions of the contact recess that extends into the channel layer. In certain embodiments of the present invention, an ohmic contact is provided on the contact region that does not extend onto the channel layer in the area of the sidewalls. In other embodiments of the present invention, the ohmic contact extends onto the channel layer in the area of the sidewalls.

In additional embodiments of the present invention, the surface area enlargement structure includes holes extending into the channel layer with n-type nitride-based semiconductor material in the and the ohmic contact is in contact with the nitride-based semiconductor material in the holes.

The n-type nitride-based semiconductor material may include InN, AlGaN, InGaN, AlInGaN, AlInN and/or GaN. The n-type nitride-based semiconductor material may be doped with Si, Ge and/or O. A silicon nitride layer may also be provided on the barrier layer and the gate contact may be provided in a recess in the silicon nitride layer.

Further embodiments of the present invention provide a high electron mobility transistor and methods of fabricating a transistor that includes a nitride-based channel layer on a substrate and a barrier layer on the nitride-based channel layer. At least one contact recess is provided in the barrier layer that extends into the channel layer. A region of metal and/or metal alloy is provided on the nitride-based channel layer in the contact recess to provide an ohmic contact. A gate contact disposed is on the barrier layer. The region of metal may extend onto the barrier layer.

Additional embodiments of the present invention provide a high electron mobility transistor and methods of fabricating a transistor that includes a nitride-based channel layer on a substrate and a barrier layer on the nitride-based channel layer. At least one contact recess is provided in the barrier layer that extends into the channel layer. A region of n-type degenerate semiconductor material other than GaN or AlGaN is provided on the nitride-based channel layer in the contact recess. An ohmic contact is provided on the region of n-type degenerate semiconductor material and a gate contact is disposed on the barrier layer. The region of n-type degenerate semiconductor material may extend onto the barrier layer.

DETAILED DESCRIPTION OF EMBODIMENTS OF THE INVENTION

Figure 1A:
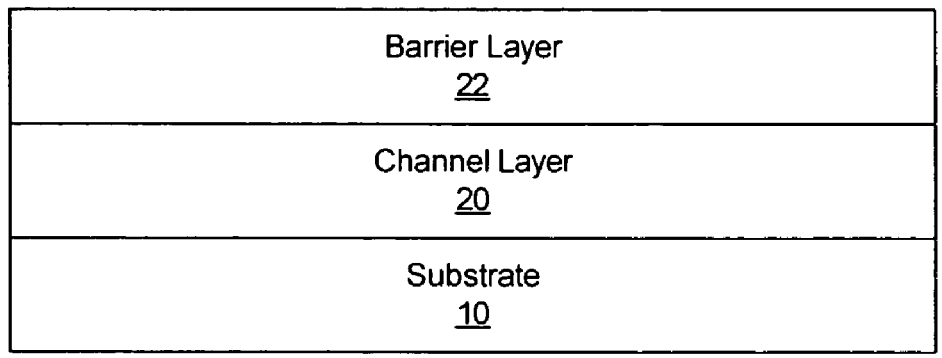
FIGS. 1A-1G are schematic drawings illustrating fabrication of ohmic contacts in transistors according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

Embodiments of the present invention provide ohmic contacts on re-grown contact regions of a Group III-nitride based transistor and methods of forming such contacts.

Embodiments of the present invention may be suited for use in nitride-based HEMTs such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Suitable structures for GaN-based HEMTs that may utilize embodiments of the present invention are described, for example, in commonly assigned U.S. Pat. No. 6,316,793 and U.S. application Ser. No. 09/904,333 filed Jul. 12, 2001 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. provisional application Ser. No. 60/290,195 filed May 11, 2001 for "GROUP III NITRIDE BASED HIGH ELECTRON MOBILITY TRANSISTOR (HEMT) WITH BARRIER/SPACER LAYER" and U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" the disclosures of which are hereby incorporated herein by reference in their entirety.

Fabrication of embodiments of the present invention is schematically illustrated in FIGS. 1A-1G. As seen in FIG. 1A, a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ $\Omega$-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in commonly assigned U.S. patent application Ser. No. 10/199,786, filed Jul. 19, 2002 and entitled "STRAIN BALANCED NITRIDE HETROJUNCTION TRANSISTORS AND METHODS OF FABRICATING STRAIN BALANCED NITRIDE HETEROJUNCTION TRANSISTORS", and U.S. Provisional Patent Application Ser. No. 60/337,687, filed Dec. 3, 2001 and entitled "STRAIN BALANCED NITRIDE HETEROJUNCTION TRANSISTOR," the disclosures of which are incorporated herein by reference as if set forth fully herein.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,592,501, the contents of which are also incorporated herein by reference in their entirety.

Although silicon carbide may be the preferred substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Returning to FIG. 1A, a channel layer 20 is provided on the substrate 10. The channel layer 20 may be deposited on the substrate 10 using buffer layers, transition layers, and/or nucleation layers as described above. The channel layer 20 may be under compressive strain. Furthermore, the channel layer and/or buffer nucleation and/or transition layers may be deposited by MOCVD or by other techniques known to those of skill in the art, such as MBE or HVPE.

In some embodiments of the present invention, the channel layer 20 is a Group III-nitride, such as $Al_xGa_{1-x}N$ where $0 \leq x < 1$, provided that the bandgap of the channel layer 20 is less than the bandgap of the barrier layer 22. In certain embodiments of the present invention, x=0, indicating that the channel layer 20 is GaN. The channel layer 20 may also be other Group III-nitrides such as InGaN, AlInGaN or the like. The channel layer 20 may be undoped ("unintentionally doped") and may be grown to a thickness of greater than about 20 Å. The channel layer 20 may also be a multi-layer structure, such as a superlattice or combinations of GaN, AlGaN or the like.

A barrier layer 22 is provided on the channel layer 20. The channel layer 20 may have a bandgap that is less than the bandgap of the barrier layer 22. The barrier layer 22 may be deposited on the channel layer 20. In certain embodiments of the present invention, the barrier layer 22 is AlN, AlInN, AlGaN or AlInGaN with a thickness of between about 1 and about 100 nm. In some embodiments of the present invention, the barrier layer 22 includes multiple layers. For example, the barrier layer 22 may be about 1 nm of AlN with about 25 nm of AlGaN on the AlN layer. Examples of barrier layers according to certain embodiments of the present invention are described in U.S. patent application Ser. No. 10/102,272, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein.

The barrier layer 22 may be a Group III-nitride and has a bandgap larger than that of the channel layer 20. Accordingly, in certain embodiments of the present invention, the barrier layer 22 is AlGaN, AlInGaN and/or AlN or combinations of layers thereof. Other materials may also be used for the barrier layer 22. For example, $ZnGeN_2$, $ZnSiN_2$ and/or $MgGeN_2$ could also be used. The barrier layer 22 may, for example, be from about 1 to about 100 mm thick, but is not so thick as to cause cracking or substantial defect formation therein. Preferably, the barrier layer 22 is undoped or doped with an n-type dopant to a concentration less than about $10^{19}$ $cm^{-3}$. In some embodiments of the present invention, the barrier layer 22 is $Al_xGa_{1-x}N$ where $0<x<1$. In such embodiments, the barrier layer 22 may be from about 3 to about 30 nm thick. In particular embodiments, the aluminum concentration is about 25%. However, in other embodiments of the present invention, the barrier layer 22 comprises AlGaN with an aluminum concentration of between about 5% and about 100%. In specific embodiments of the present invention, the aluminum concentration is greater than about 10%. In embodiments of the present invention where the barrier layer 22 comprises an AlN layer, the thickness of the barrier layer 22 may, for example, be from about 0.3 nm to about 4 nm.

Figure 1B:
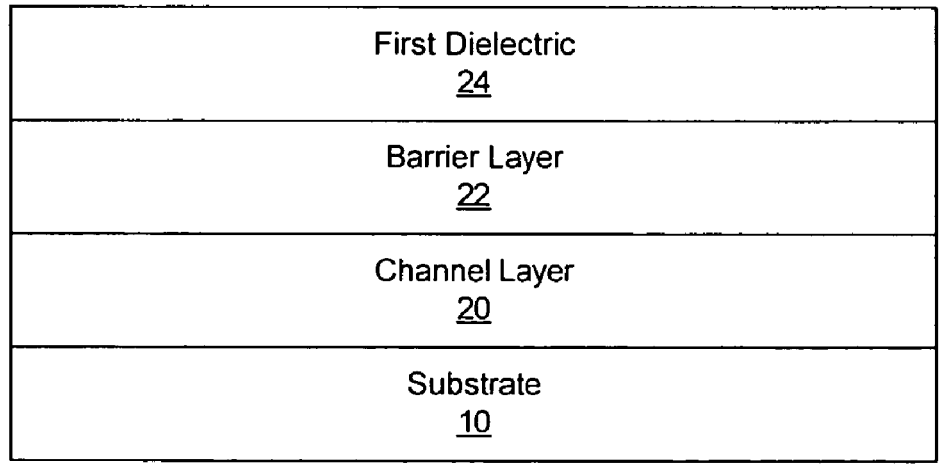

FIG. 1B illustrates formation of an optional first dielectric layer 24. The first dielectric layer 24 may be a silicon nitride layer, such as an $Si_xN_y$ layer. The silicon nitride layer may serve as a passivation layer for the device. The silicon nitride layer may be deposited by, for example, plasma-enhanced chemical vapor deposition (PECVD), low pressure chemical vapor deposition (LPCVD) and/or sputtering. The silicon nitride layer may be deposited in the same reactor as other layers of the transistor. In some embodiments of the present invention, other dielectrics may also be utilized, such as, for example, silicon oxynitride and/or silicon dioxide.

Figure 1C:
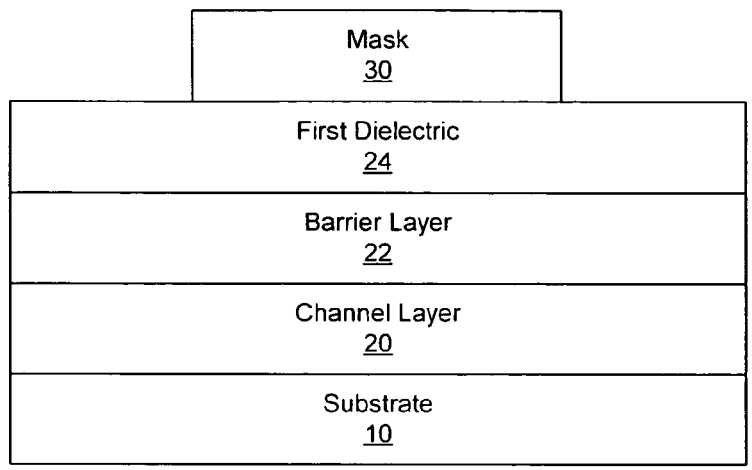

FIG. 1C illustrates formation of a mask 30 on the first dielectric layer 24. The mask 30 is formed on the region of the barrier layer 22 where a gate contact will subsequently be formed. As illustrated in FIG. 1C, the wafer of FIG. 1C may be removed from the epi reactor and patterned with a mask material 30 to expose the desired recess areas. The mask material 30 should be able to withstand the growth temperature of subsequent processing, including the formation of regrown contact regions 26 as described below. In particular embodiments of the present invention, the mask 30 is provided by an oxide. In certain embodiments of the present invention, the mask 30 is patterned using lift-off techniques. Alternatively, a wet or dry etch could be utilized to pattern the mask 30. In certain embodiments of the present invention, SiO is the mask material, although other materials, such as AlN and $Si_xN_y$ based materials, may also be used. A photoresist, e-beam resist material or organic mask material may also be utilized if it is not unduly damaged by subsequent processing steps, such as deposition temperatures or the like.

Figure 1D:
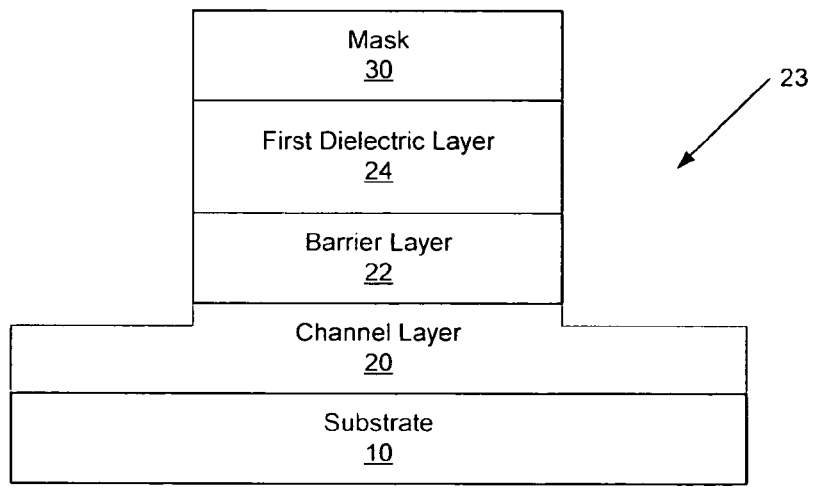

As illustrated in FIG. 1D, after formation and patterning of the mask 30 so as to leave the mask material in the regions where contact recesses 23 are not to be formed for the ohmic contacts, the recesses are etched through the first dielectric layer 24, through the barrier layer 22, to the channel layer 20 and, in some embodiments, to and into the channel layer 20 or, in some embodiments, even through the channel layer 20. The etch to form the contact recesses 23 may be provided by, for example, a wet etch, a dry etch and/or a reactive ion etch or the like. Optionally, the structure may be annealed to remove and/or reduce damage resulting from the etch. Furthermore, optionally, the periphery of the device may be etched to form a mesa structure (not shown), for example, if other termination structures, such as a field plate, implant or other termination structure are not provided or may be provided in addition to such structures.

Figure 1E:
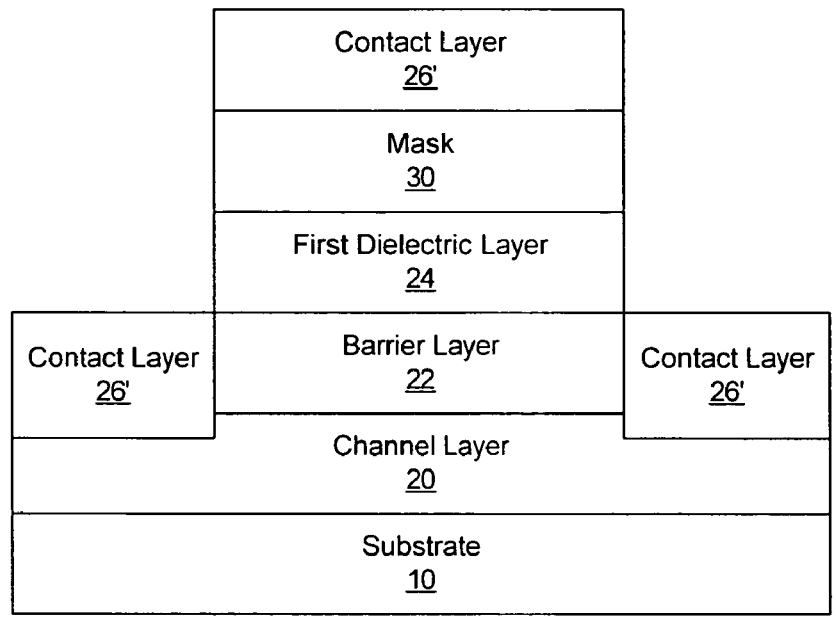

As illustrated in FIG. 1E, after etching the contact recesses 23, a contact layer 26' is formed on the exposed regions of the channel layer 20 and the mask 30. For example, the wafer of FIG. 1D may be put back into the epi reactor for deposition of the contact layer 26'. In some embodiments of the present invention, the contact layer 26' is formed by metal organic chemical vapor deposition (MOCVD), molecular beam epitaxy (MBE), plasma enchanced chemical vapor deposition (PECVD), sputtering and/or hydride vapor phase epitaxy (HVPE). In some embodiments, the contact layer 26' is regrown at a reduced deposition temperature. In particular, a low temperature deposition process may be used. As used herein "low temperature deposition" refers to formation of a layer at a temperature lower than a temperature at which substantial mass transport from the wafer to the regrown region takes place. For example, the contact layer 26' may be formed at a temperature of from about room temperature to about 950° C. In some embodiments, the contact layer 26' is formed at a temperature of less than 960° C. In particular embodiments of the present invention, the contact layer 26' is formed at a very low temperature, for example, at a temperature of less than about 450° C. and in some embodiments, at temperature of less than about 200° C. Such very low temperature conditions may be used, for example, with sputtering and/or PECVD growth techniques. The use of a reduced deposition temperature and/or low temperature deposition may reduce trapping and/or may provide improved reliability.

As discussed below, the contact layer 26' may be unevenly formed such that the portion on the mask 30 is porous or discontinuous. In some embodiments, the contact layer 26' is not formed on the mask 30. Such a selective formation of the contact layer 26' may depend on the composition of the contact layer 26', the mask 30 and the growth conditions for the contact layer 26'.

In some embodiments of the present invention, the contact layer 26' may be an n-type degenerate semiconductor material. In certain embodiments of the present invention, the contact layer 26' may be heavily doped n-type InN, InAlN, AlGaN, AlInGaN, GaN and/or InGaN. In other embodiments of the present invention, the contact layer 26' may be an n-type degenerate semiconductor material other than GaN or AlGaN. For example, the contact layer may be a non-nitride Group III-V semiconductor material, a Group IV semiconductor material and/or a Group II-VI semiconductor material. Examples of potential contact layer 26' materials include, for example, ZnO, $ZnGeN_2$ and/or $ZnSnN_2$. In other embodiments of the present invention, the contact layer 26' may be a metal or metal alloy, for example, a metal silicide, capable of conformal deposition at a low temperature that has a low work function and does not form a Schottky contact. For example, an MOCVD conformal deposition of Al using DMAlH at a temperature of at least about 200° C. to touch the 2DEG. The metal may be subsequently etched off in the channel and gate regions. Furthermore, a passivation layer may be deposited before deposition of the metal.

Formation of a GaN contact layer 26' may reduce and/or eliminate a band discontinuity with the channel layer 22 if the channel layer 22 is also GaN. The contact layer 26' is formed to a thickness sufficient to provide a low sheet resistivity. For example, the contact layer 26' may be grown to a thickness sufficient to provide a sheet resistivity that is less than a sheet resistivity of the 2DEG formed at the interface between the channel layer 20 and the barrier layer 22. Several tens of nanometers of GaN, for example, may be sufficient thickness for the contact layer 26', however, a thicker layer may have a lower resistances and increase transfer length ($L_T$). The contact layer 26' may be doped with Si, Ge and/or O or other suitable n-type dopant or may be naturally n-type as deposited. The contact layer 26' may be doped as formed rather than through subsequent ion implantation. Formation of the doped contact layer 26' without ion implantation may avoid the need for extremely high temperature annealing to activate the dopants. In particular embodiments of the present invention, the contact layer 26' has a sheet resistivity of from about 10 to about 400 Ω/□. In certain embodiments of the present invention, the contact layer is doped to provide a carrier concentration of from about $10^{18}$ to about $10^{21}$ cm$^{-3}$. In still further embodiments of the present invention, the contact layer 26' is from about 10 nm to about 1000 nm thick.

For a contact layer 26' that is not a Group III nitride material, the mask 30 may not be needed as the material could be blanket deposited and then patterned and etched after deposition.

Figure 1F:
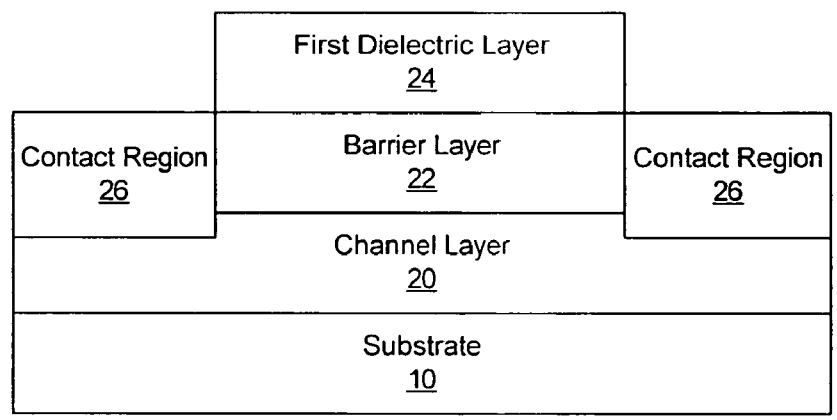

FIG. 1F illustrates removal of the portion of the contact layer 26' formed on the mask 30 and removal of the mask 30 to expose the first dielectric layer 24, thus providing the contact regions 26. The mask 30 and the portion of the contact layer 26' may be removed, for example, by etching the mask 30 in buffered HF or other etchant that will remove the mask layer 30 and leave the first dielectric layer 24 and the contact regions 26. In some embodiments of the present invention, the portion of the contact layer 26' is formed on the mask 30 may be formed so as to be porous or discontinuous so as to allow etching the mask 30 through the contact layer 26'. In such a way, the mask 30 may be etched with an etchant that has etching selectivity with respect to the contact layer 26' and the first dielectric layer 24. For smaller geometry devices, the mask layer 30 may be etched from the sides to remove the mask layer and the portion of the contact layer 26' on the mask layer 30, for example, if the portion of the contact layer 26' on the mask layer is not porous or is continuous.

Figure 1G:
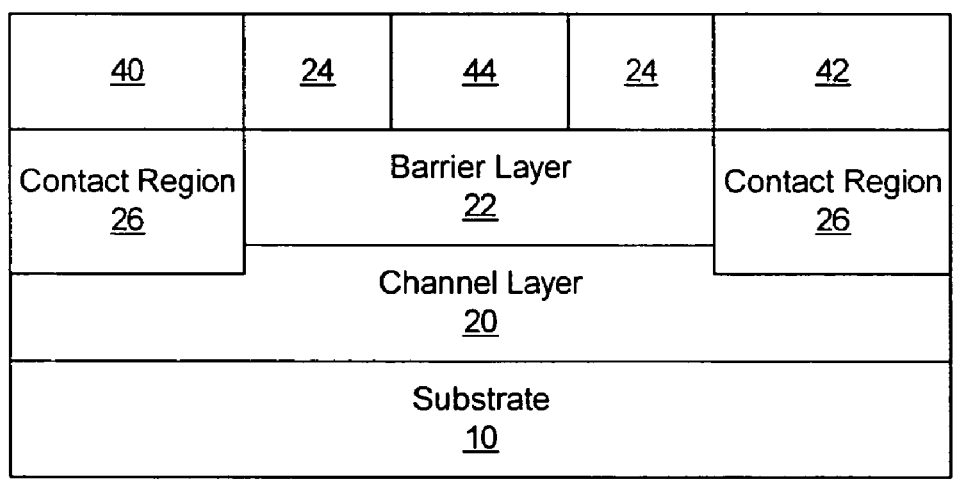

FIG. 1G illustrates formation of a gate recess in the first dielectric layer 24 and formation of a gate contact 44 on the exposed portion of the barrier layer 22 in the gate recess. For example, a gate recess may be etched through the first dielectric layer 24 using, for example, a dry etch, a wet etch and/or RIE or the like. Optionally, the structure may be annealed to repair some or all of the damage resulting from the etch of the gate recess. Suitable gate contact materials include, for example, Ni, Pt, Pd or other such Schottky contact materials. Additional overlayers may also be provided. In some embodiments of the present invention, the gate contact 44 may be formed on the dielectric layer 24.

As is further seen in FIG. 1G, ohmic contacts 40 and 42 are formed on the contact regions 26 and may provide source and drain contacts. The ohmic contacts 40 and 42 may be formed before or after formation of the gate recess and/or contact 44. In some embodiments of the present invention, the ohmic contacts 40 and 42 are annealed, for example at a temperature of about 850° C. or less. In other embodiments, the anneal of the ohmic contacts is not carried out. The use of a reduced anneal temperature or no anneal may reduce trapping and/or may provided improved reliability. The presence of the highly doped n-type contact regions may lower contact resistance that may provide for increased efficiency and/or radio frequency power density. Suitable ohmic contact materials include, for example, a Ti/Al/Ni/Au stack may be used. Similarly, a structure of Ti/Al/X/Au may be used where X may be Mo, Pt and/or Ti.

While embodiments of the present invention have been described with reference to a blanket deposition of the contact layer 26', alternatively, selective regrowth of the contact regions 26 could also be utilized while still benefiting from the teachings of the present invention. Furthermore, the regrown contact regions 26 may be provided for only one of the ohmic contacts 40 and 42 and a conventional contact structure provided for the other contact. Accordingly, embodiments of the present invention should not be construed as limited to the specific processing steps illustrated in FIGS. 1A-1G.

Furthermore, while a specific sequence of processing steps has been described, deviation from this sequence may be provided while still being within the scope of embodiments of the present invention. For example, the gate recess and gate contact may be formed before or after formation of the ohmic contacts or even before formation of the contact recesses. Accordingly, embodiments of the present invention should not be construed as limited to the specific sequence of operations described above.

Figure 2:
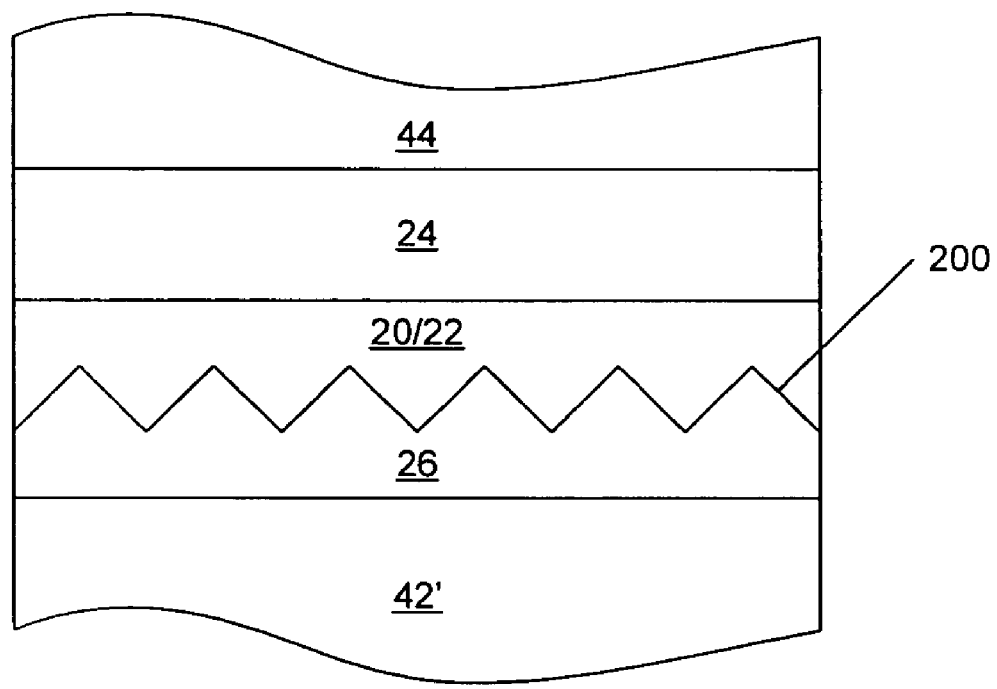
FIG. 2 is a schematic illustration of transistors according to further embodiments of the present invention.
Figure 3A:
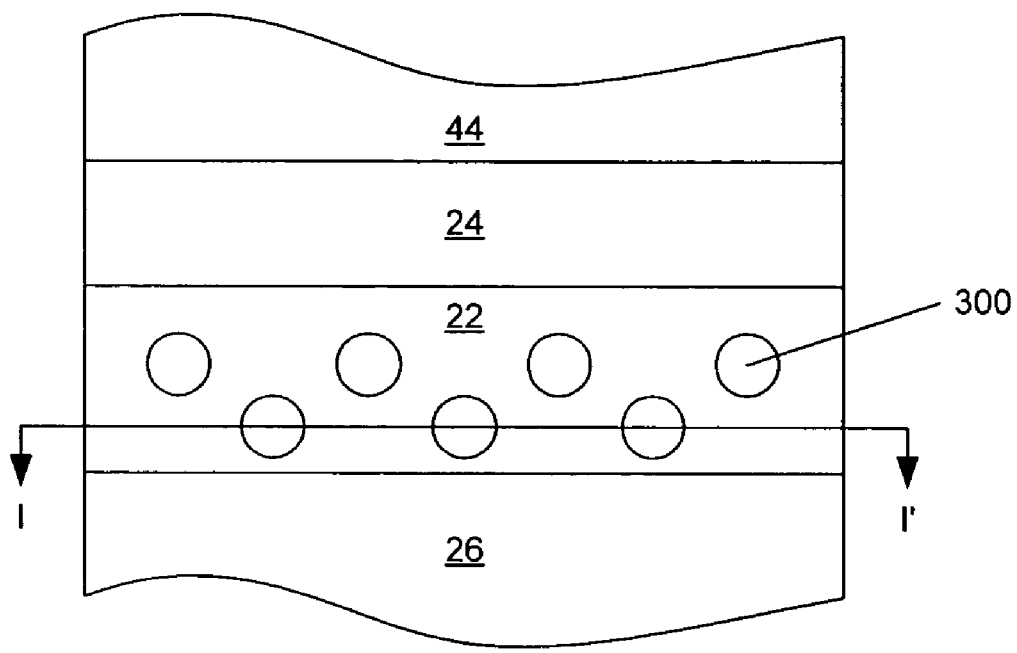
FIGS. 3A and 3B are schematic illustrations of transistors according to further embodiments of the present invention.
Figure 3B:
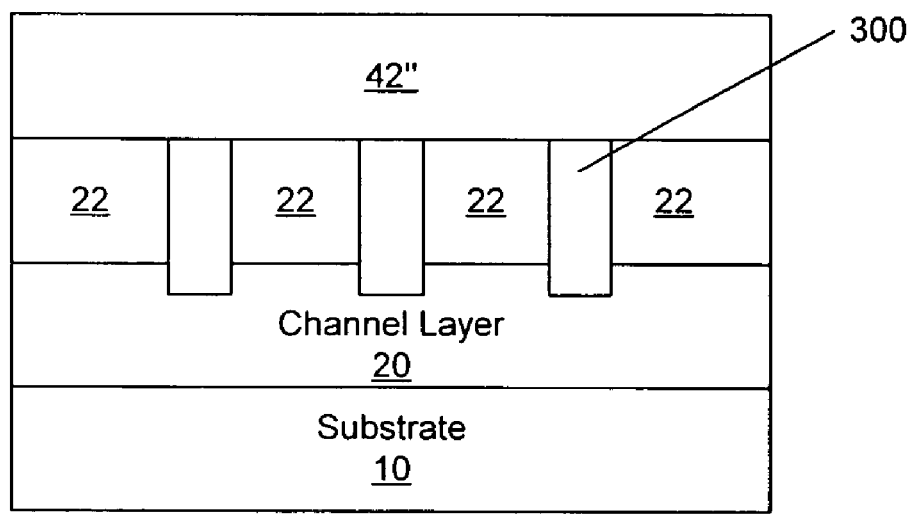

FIGS. 2, 3A and 3B are illustrations of embodiments of the present invention incorporating contact area enlargement structures that provide increased vertical surface area of the interface between the contact region 26 and the channel layer 20. FIG. 2 illustrates embodiments of the present invention as incorporating a contact area enlargement area structure in a sidewall of a portion of the channel layer 20 and FIGS. 3A and 3B illustrate embodiments of the present invention where the contact enlargement area structure is provided by filled holes extending into the contact layer 20. While each of the contact area enlargement structures is described herein separately, the contact area enlargement structures may also be provided in combination with each other or other structures that increase the vertical contact area between the channel layer 20 and the contact region 26 as compared to a planar vertical contact area. Such structures may provide means for increasing a surface area of an interface between a vertical portion of the n-type nitride-based semiconductor material contact region 26 and the nitride-based channel layer 20.

FIGS. 2, 3A and 3B illustrate a partial section of a transistor illustrating a single ohmic contact region. As will be appreciated by those of skill in the art, a corresponding section may be provided for a second ohmic contact region opposite the gate contact so as to provide source and drain contacts. Alternatively, embodiments of the present invention may provide a contact area enlargement structure for only one of the ohmic contacts.

FIG. 2 is a top view of a portion of a HEMT according to further embodiments of the present invention. As seen in FIG. 2, the surface area of the interface between the contact region 26 and the channel layer 20 and/or the barrier layer 22 may be increased by providing an increased surface area sidewall 200 of the channel layer 20 and/or the barrier layer 22. The increased surface area sidewall 200 has an increased surface area with respect to a straight sidewall. Increasing the surface area of the interface between the contact region 26 and the channel layer 20 may reduce the resistance between the contact region 26 and the channel layer 20.

The patterned sidewall 200 may be provided by patterning the channel layer 20 during the contact recess etch described above. For example, a first etch through the first dielectric layer 24 and the barrier layer 22 may be performed and then a second etch into the channel layer 22 may be performed with a mask on the exposed portion of the channel layer 20 to provide the pattern of the sidewall. Alternatively, a single etch may be performed if the mask 30 has a pattern corresponding to the desired sidewall pattern of the channel layer 20.

The sidewall may have a regular or irregular repeating or non-repeating shape. The sawtooth shape illustrated in FIG. 2 is provided as an example of a shape that may be used. However, other shapes may also be used, for example, a notch shape, a series of curves or the like may be used. Accordingly, some embodiments of the present invention should not be limited to a particular shape for the increased surface area sidewall 200.

The ohmic contact metal 42' is also illustrated in FIG. 2 on the contact region 26. The contact metal 42' is illustrated as stopping before the periphery of the contact region 26. However, the contact metal 42' may extend further than illustrated and may, for example, extend onto the channel layer 22.

FIG. 3A is a top view and FIG. 3B is a cross-section taken along the lines I-I' of FIG. 3A of further embodiments of the present invention. As seen in FIG. 3, the surface area of the interface between the regrown contact region 26 and the channel layer 20 may be increased by providing holes 300 that extend into the channel layer 20. The holes 300 have n-type material in them as provided in the contact region 26. The ohmic contact 42'' extends to cover the holes 300 so that the n-type material in the holes 300 is electrically connected to the contact region 26.

The filled holes 300 may be provided by patterning the channel layer 20 during the contact recess etch described above so as to provide holes that are present when the contact layer 26' is formed. For example, a first etch through the first dielectric layer 24 and the barrier layer 22 may be performed and then a second etch into the channel layer 22 may be performed with a mask on the exposed portion to the channel layer 20 to provide the holes.

Alternatively, a single etch may be performed if the mask 30 has a pattern corresponding to the desired holes of the channel layer 20. In such a case, the holes would extend through the barrier layer 22 and to or into the channel layer 20. The contact metal would then extend onto the barrier layer 22 to contact the material in the holes 300 as illustrated in FIG. 3B.

The holes 300 may have a regular or irregular repeating or non-repeating pattern. Furthermore, the holes 300 may also have a circular or other shape periphery. The pattern of holes and shape of holes illustrated in FIG. 3A is provided as an example of a pattern and shape that may be used. However, other patterns and/or shapes may also be used. Accordingly, some embodiments of the present invention should not be limited to a particular pattern and/or shape for the holes 300.

Figure 4A:
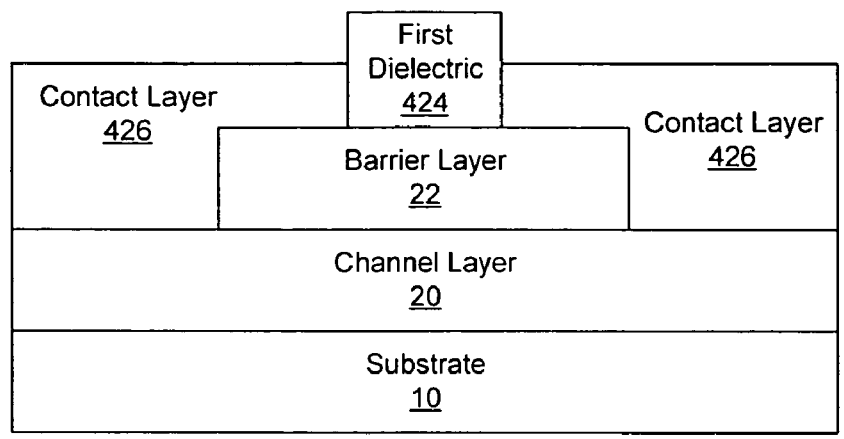
FIGS. 4A-4C are schematic illustrations of fabrication of transistors according to further embodiments of the present invention.
Figure 4B:
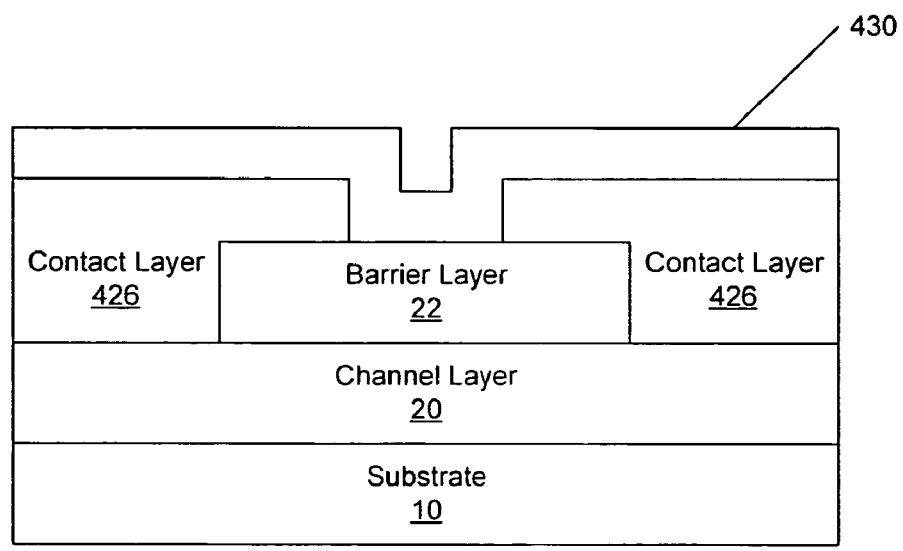
Figure 4C:
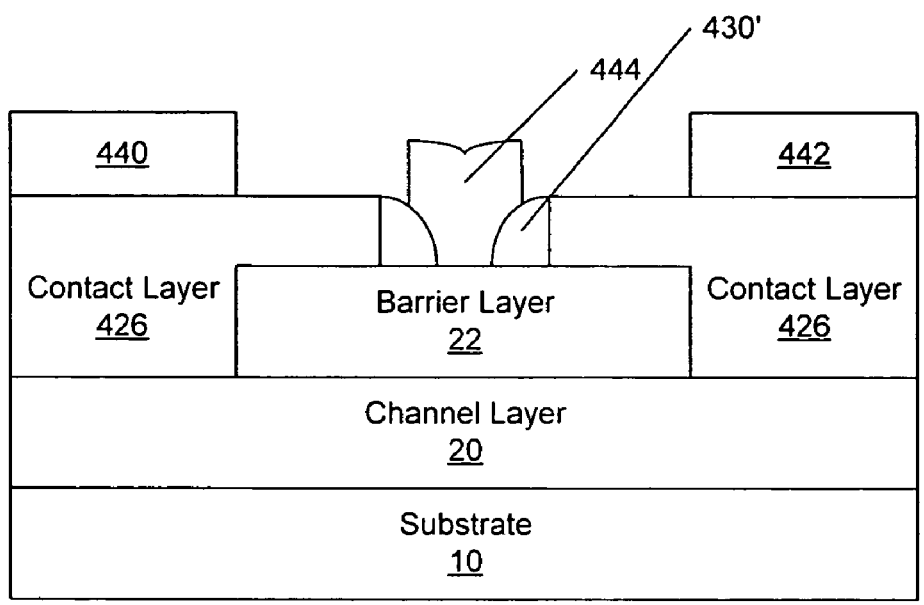

FIGS. 4A-4C illustrate fabrication of further embodiments of the present invention where a contact region is provided that extends onto the barrier layer. Fabrication of the embodiments of the present invention illustrated in FIGS. 4A-4C may be the same as that illustrated in FIGS. 1A-1F except that the first dielectric layer 24 is resized to a smaller size first dielectric layer 424 so as to expose a portion of the barrier layer 22, for example, by undercutting the mask 30 into the first dielectric layer 24 with an isotropic etch. Alternatively, the mask 30 could be stripped and another mask applied and the first dielectric layer 24 may be etched using this second mask. While the first dielectric layer 424 in FIG. 4A is described herein as a dielectric material, other removable materials that may withstand the conditions for deposition of the contact regions may be used.

As seen in FIG. 4A, the contact region 426 is regrown as discussed above and the mask 30 is removed. As seen in FIG. 4B, the first dielectric layer 424 is removed and a second dielectric layer 430 is conformally deposited on the contact layers 426 and the barrier layer 22. The second dielectric layer 430 would typically be deposited isotropically. Windows in the second dielectric layer 430 may be provided on the contact layer 426 and ohmic contacts for the source and drain contacts 440 and 442 may be formed on the contact layer 426. The ohmic contacts may also be formed prior to the deposition of the second dielectric layer 430.

As seen in FIG. 4C, the second dielectric layer 430 is anisotropically etched to expose the barrier layer 22 and provide sidewall spacers 430' and a gate contact recess. A gate metal may be deposited and patterned, for example, using lift-off techniques, to provide the gate contact 444. The length of the gate contact 444 may be approximately the width of the first dielectric layer 424 less twice the thickness of the second dielectric layer 430. In particular embodiments of the present invention, the first dielectric 424 may have a width of about 0.5 to about 1 μm and the second dielectric 430 may have a thickness of from about 0.1 to about 0.5 μm.

While embodiments of the present invention have been illustrated with regrown contact regions for both the source and drain contacts, such regrown regions may be provided for only one of the source or the drain. Furthermore, while the gate contacts have been illustrated as substantially centered between the source and drain, in certain embodiments of the present invention, the gate contact may be offset, for example, toward the source contact.

Furthermore, while embodiments of the present invention have been described with reference to a particular sequence of fabrication steps, a different sequence of steps may be utilized while still falling within the scope of the present invention. Accordingly, embodiments of the present invention should not be construed as limited to the particular sequence of steps described herein.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A method of fabricating a transistor, comprising:
   forming a nitride-based channel layer on a substrate;
   forming a barrier layer on the nitride-based channel layer;
   forming a contact recess in the barrier layer to expose a contact region of the nitride-based channel layer;
   forming a contact layer on the exposed contact region of the nitride-based channel layer using a low temperature deposition process;
   forming an ohmic contact on the contact layer;
   forming a gate contact disposed on the barrier layer adjacent the ohmic contact;
   forming a first dielectric layer on the barrier layer;
   forming a gate recess in the first dielectric layer;
   wherein forming a gate contact comprises forming a gate contact in the gate recess; and
   wherein forming a contact recess comprises forming an ohmic contact recess in the first dielectric layer and the barrier layer that expose a portion of the nitride-based channel layer.

2. The method of claim 1, wherein the first dielectric layer comprises a silicon nitride layer.

3. The method of claim 2, wherein the silicon nitride layer provides a passivation layer for the transistor.

4. A method of fabricating a transistor, comprising:
   forming a nitride-based channel layer on a substrate;
   forming a barrier layer on the nitride-based channel layer;
   forming a contact recess in the barrier layer to expose a contact region of the nitride-based channel layer;
   forming a contact layer on the exposed contact region of the nitride-based channel layer using a low temperature deposition process;
   forming an ohmic contact on the contact layer;
   forming a gate contact disposed on the barrier layer adjacent the ohmic contact;
   forming a first dielectric layer on the barrier layer;
   wherein forming a gate contact comprises forming a gate contact in the first dielectric layer; and
   wherein forming a contact recess comprises forming an ohmic contact recess in the first dielectric layer and the barrier layer that expose a portion of the nitride-based channel layer.

5. A method of fabricating a transistor, comprising:
   forming a nitride-based channel layer on a substrate;
   forming a barrier layer on the nitride-based channel layer;
   forming a contact recess in the baffler layer to expose a contact region of the nitride-based channel layer;
   forming a contact layer on the exposed contact region of the nitride-based channel layer using a low temperature deposition process;
   forming an ohmic contact on the contact layer; forming a gate contact disposed on the baffler layer adjacent the ohmic contact;
   forming holes in the channel layer adjacent the contact regions;
   placing n-type nitride-based semiconductor material in the holes; and
   wherein forming an ohmic contact on the contact layer comprises forming an ohmic contact on the contact layer and on the n-type nitride-based semiconductor material in the holes.

6. A method of fabricating a transistor, comprising:
   forming a nitride-based channel layer on a substrate;
   forming a barrier layer on the nitride-based channel layer;
   forming a masking layer on the barrier layer;
   patterning the masking layer and the barrier layer to provide a contact opening that exposes a portion of the nitride-based channel layer;
   forming a contact layer on the exposed portion of the nitride-based channel layer and the masking layer;
   selectively removing the masking layer and a portion of the contact layer on the masking layer to provide a nitride-based contact region;

forming an ohmic contact on the nitride-based contact region; and forming a gate contact disposed on the barrier layer adjacent the ohmic contact.

7. The method of claim 6, further comprising:
forming a first dielectric layer on the barrier layer;
forming a recess in the first dielectric layer;
wherein forming a gate contact comprises forming a gate contact in the recess;
wherein forming a masking layer on the barrier layer comprises forming a masking layer on the first dielectric layer; and
wherein patterning the masking layer and the barrier layer to provide a contact opening that exposes a portion of the nitride-based channel layer comprises patterning the masking layer, the first dielectric layer and the barrier layer to provide a contact opening that exposes a portion of the nitride-based channel layer.

8. The method of claim 6, wherein the first dielectric layer comprises a silicon nitride layer.

9. The method of claim 8, wherein the silicon nitride layer provides a passivation layer for the transistor.

10. The method of claim 6, wherein the masking layer comprises a dielectric layer.

11. The method of claim 10, wherein the dielectric layer comprises a silicon oxide layer.

12. The method of claim 6, wherein the masking layer comprises a photoresist and/or e-beam resist masking layer.

13. The method of claim 6, wherein forming an ohmic contact comprises forming an ohmic contact without annealing the ohmic contact.

14. The method of claim 6, wherein forming an ohmic contact comprises:
patterning a metal layer on the nitride-based contact region; and
annealing the patterned metal layer at a temperature of less than about 850 C.

15. The method of claim 6, wherein forming a nitride based contact layer on the exposed portion of the nitride-based channel layer and the masking layer comprises forming a nitride based contact layer by metal organic chemical vapor deposition (MOCVD), molecular beam epitaxy (MBE), plasma enchanced chemical vapor deposition (PECVD), sputtering and/or hydride vapor phase epitaxy (HVPE).

16. The method of claim 6, wherein forming a nitride based contact layer on the exposed portion of the nitride-based channel layer and the masking layer comprises forming a nitride based contact layer on the exposed portions of the nitride-based channel layer and the masking layer to a thickness sufficient to provide a sheet resistivity of less than a sheet resistivity of a two-dimensional electron gas region formed at an interface between the channel layer and the baffler layer.

17. The method of claim 6, wherein forming a nitride based contact layer comprises forming n-type an InGaN, GaN, AlGaN, InAlGaN, InAlN and/or InN layer.

18. The method of claim 17, wherein the InGaN, GaN, AlGaN, InAlGaN, InAlN and/or InN layer is doped with Si, Ge and/or O during formation.

19. The method of claim 6, wherein the nitride based contact layer comprises an n-type degenerate semiconductor material other than GaN and AlGaN.

20. The method of claim 19, wherein the nitride based contact layer comprises a non-nitride Group III-V semiconductor material, a Group IV semiconductor material and/or a group II-VI semiconductor material.

21. The method of claim 6, further comprising forming sidewalls of the channel layer to provide an increased surface area interface between the nitride based channel layer and the nitride based contact layer in comparison to a planar interface.

22. The method of claim 21, wherein forming an ohmic contact comprises forming an ohmic contact on the nitride-based contact region that extends onto a portion of the channel layer.

23. The method of claim 21, wherein forming an ohmic contact comprises forming an ohmic contact on the nitride-based contact region that terminates before the sidewall of the channel layer.

24. The method of claim 6, further comprising:
forming holes in the channel layer adjacent the nitride-based contact region;
wherein forming a nitride based contact layer further comprises placing a nitride-based semiconductor material in the holes; and
wherein forming an ohmic contact on the nitride-based contact region comprises forming an ohmic contact on the nitride-based contact region and on the nitride-based semiconductor material in the holes.

25. The method of claim 6, wherein the contact opening comprises a first contact opening, the nitride-based contact region comprises a first nitride-based contact region and the ohmic contact comprises a first ohmic contact, the method further comprising:
patterning the masking layer and the barrier layer to provide a second contact opening that exposes a portion of the nitride-based channel layer;
forming a nitride based contact layer on the portion of the nitride-based channel layer exposed by the second contact opening;
wherein selectively removing the masking layer comprises selectively removing the masking layer and a portion of the nitride based contact layer on the masking layer to provide the first nitride-based contact region and a second nitride-based contact region;
forming a second ohmic contact on the second nitride-based contact region; and
wherein forming a gate contact comprises forming a gate contact disposed on the barrier layer between the first and second ohmic contacts.

26. The method of claim 6, further comprising a contact recess that exposes a portion of the barrier layer and wherein forming a nitride based contact layer comprises forming a contact layer that extends onto the exposed portion of the barrier layer.

* * * * *

UNITED STATES PATENT AND TRADEMARK OFFICE
CERTIFICATE OF CORRECTION

PATENT NO. : 7,432,142 B2  
APPLICATION NO. : 10/849617  
DATED : October 7, 2008  
INVENTOR(S) : Saxler et al.

It is certified that error appears in the above-identified patent and that said Letters Patent is hereby corrected as shown below:

Title Page, Item 56, References Cited, Foreign Patent Documents, Page 2:  
Please correct "JP 2001230401 A 8/2001"  
To read -- JP 2001230407 A 8/2001 --

Column 14, Claim 5, Line 40: Please correct "baffler"  
To read -- barrier --

Column 14, Claim 5, Line 46: Please correct "baffler"  
To read -- barrier --

Column 15, Claim 16, Line 52: Please correct "baffler"  
To read -- barrier --

Signed and Sealed this

Second Day of December, 2008

JON W. DUDAS  
*Director of the United States Patent and Trademark Office*